(12) United States Patent
Kub et al.

(10) Patent No.: US 9,105,499 B1
(45) Date of Patent: Aug. 11, 2015

(54) COMPLEMENTARY FIELD EFFECT TRANSISTORS USING GALLIUM POLAR AND NITROGEN POLAR III-NITRIDE MATERIAL

(71) Applicants: Francis J. Kub, Arnold, MD (US); Travis J. Anderson, Alexandria, VA (US); Michael A. Mastro, Fairfax, VA (US); Charles R. Eddy, Jr., Columbia, MD (US); Jennifer K. Hite, Arlington, VA (US)

(72) Inventors: Francis J. Kub, Arnold, MD (US); Travis J. Anderson, Alexandria, VA (US); Michael A. Mastro, Fairfax, VA (US); Charles R. Eddy, Jr., Columbia, MD (US); Jennifer K. Hite, Arlington, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/666,494

(22) Filed: Mar. 24, 2015

Related U.S. Application Data

(63) Continuation of application No. 14/170,161, filed on Jan. 31, 2014, now Pat. No. 9,018,056, and a continuation of application No. 14/578,146, filed on Dec. 19, 2014.

(60) Provisional application No. 61/790,591, filed on Mar. 15, 2013, provisional application No. 61/787,280, filed on Mar. 15, 2013, provisional application No. 61/789,160, filed on Mar. 15, 2013, provisional application No. 61/787,783, filed on Mar. 15, 2013.

(51) Int. Cl.
| | |
|---|---|
| *H01L 29/778* | (2006.01) |
| *H01L 27/092* | (2006.01) |
| *H01L 21/335* | (2006.01) |
| *H01L 21/8252* | (2006.01) |
| *H01L 29/78* | (2006.01) |
| *H01L 21/8228* | (2006.01) |
| *H01L 29/66* | (2006.01) |
| *H01L 29/205* | (2006.01) |
| *H01L 29/20* | (2006.01) |
| *H01L 21/8238* | (2006.01) |

(52) U.S. Cl.
CPC ........ *H01L 27/0922* (2013.01); *H01L 21/8228* (2013.01); *H01L 21/8238* (2013.01); *H01L 21/8252* (2013.01); *H01L 27/092* (2013.01); *H01L 27/0921* (2013.01); *H01L 29/2003* (2013.01); *H01L 29/205* (2013.01); *H01L 29/66462* (2013.01); *H01L 29/778* (2013.01); *H01L 29/7782* (2013.01); *H01L 29/7783* (2013.01); *H01L 29/7784* (2013.01); *H01L 29/7786* (2013.01); *H01L 29/7787* (2013.01); *H01L 29/7831* (2013.01)

(58) Field of Classification Search
CPC ............ H01L 29/2003; H01L 29/7787; H01L 29/66462; H01L 29/7783; H01L 29/205; H01L 29/778; H01L 29/7782; H01L 29/7786; H01L 21/8238; H01L 21/8228; H01L 27/092; H01L 27/0922; H01L 27/0921
See application file for complete search history.

(56) References Cited

U.S. PATENT DOCUMENTS

| | | | | | |
|---|---|---|---|---|---|
| 4,732,870 | A | * | 3/1988 | Mimura | ........................ 438/169 |
| 5,479,033 | A | * | 12/1995 | Baca et al. | .................... 257/192 |

(Continued)

*Primary Examiner* — Marvin Payen
*Assistant Examiner* — Jeremy Joy
(74) *Attorney, Agent, or Firm* — US Naval Research Laboratory; Stephen T. Hunnius

(57) ABSTRACT

A device with complementary non-inverted N-channel and inverted P-channel field effect transistors comprising a layer grown epitaxially on a substrate, a barrier layer, a two-dimensional electron gas in the first III-Nitride epitaxial layer, a second III-Nitride material layer, and a two-dimensional hole gas in the second III-Nitride epitaxial layer. A device with complementary inverted N-channel and non-inverted P-channel field effect transistors comprising a nitrogen-polar III-Nitride layer grown epitaxially, a barrier material layer, a two-dimensional hole gas, and a two-dimensional electron gas in the second III-Nitride epitaxial layer. A method of making complementary inverted P-channel and non-inverted N-channel III-Nitride field effect transistors. A method of making a complementary non-inverted P-channel field effect transistor and inverted N-channel III-Nitride field effect transistor on a substrate.

12 Claims, 4 Drawing Sheets

(56) References Cited

U.S. PATENT DOCUMENTS

| | | | |
|---|---|---|---|
| 6,555,839 B2 * | 4/2003 | Fitzgerald | 257/18 |
| 2005/0133816 A1 * | 6/2005 | Fan et al. | 257/190 |
| 2007/0138565 A1 * | 6/2007 | Datta et al. | 257/369 |
| 2009/0267078 A1 * | 10/2009 | Mishra et al. | 257/76 |
| 2010/0327322 A1 * | 12/2010 | Kub et al. | 257/194 |
| 2012/0068189 A1 * | 3/2012 | Hite et al. | 257/76 |
| 2013/0307027 A1 * | 11/2013 | Lu et al. | 257/194 |

* cited by examiner

COMPLEMENTARY FIELD EFFECT TRANSISTORS USING GALLIUM POLAR AND NITROGEN POLAR III-NITRIDE MATERIAL

REFERENCE TO RELATED APPLICATIONS

This application claims priority to and the benefits of U.S. patent application Ser. No. 14/170,161 filed on Jan. 31, 2014 and U.S. Provisional Patent Application No. 61/790,591 filed on Mar. 15, 2013 and U.S. Provisional Patent Application No. 61/787,280 filed on Mar. 15, 2013 and U.S. Provisional Patent Application No. 61/789,160 filed on Mar. 15, 2013 and U.S. Provisional Patent Application No. 61/787,783 filed on Mar. 15, 2013, the entireties of each are hereby incorporated by reference.

BACKGROUND

This disclosure describes monolithic III-Nitride complementary Field Effect Transistor (FET) device structures. The structures have N-channel and P-channel III-Nitride Field Effect Transistors (complementary III-Nitride FET transistors) monolithically integrated on a substrate.

SUMMARY OF DISCLOSURE

Description

This disclosure describes at least two primary device structures having N-channel and P-channel III-Nitride field effect transistors on a substrate.
Non-Inverted N-Channel and P-Channel III-Nitride Field Effect Transistor on a Substrate This disclosure describes device structures and method of fabricating monolithic N-Channel and P-Channel III-Nitride Field effect transistors fabricated on a substrate for complementary circuits having a non-inverted P-channel III-Nitride FET fabricated in nitrogen polar (nitrogen face) III-nitride epitaxial material and a non-inverted N-channel III-Nitride FET fabricated in gallium polar (gallium face) III-nitride epitaxial material.

A technology for sequentially growing nitrogen polar and then gallium polar material on a substrate is described in U.S. patent application Ser. No. 13/235,624 with the title "Method for Vertical and Lateral Control of III-N Polarity." U.S. patent application Ser. No. 13/235,624 with the title "Method for Vertical and Lateral Control of III-N Polarity" also describes how to first grow a AlN polarity inversion material layer on Nitrogen polar or sapphire substrate that allows for the growth of Gallium polar (gallium face) epitaxial III-nitride layers on the surface of the AlN polarity inversion material layer and nitrogen polar (nitrogen face) material in the selected area of the substrate that does not have the AlN polarity inversion material layer.

In the first device structure implementation, Non-Inverted P-channel III-Nitride Field Effect Transistors (FET) are implemented or fabricated in first regions on a first nitrogen-polar nitrogen face III-Nitride material and a non-inverted P-channel III-Nitride Field Effect Transistors are implemented in second regions on a second gallium-polar gallium face III-Nitride material with both first nitrogen-polar III-Nitride material and the second gallium-polar III-Nitride material grown epitaxially on a substrate.

Two or more epitaxial growth steps can be used to fabricate the non-inverted P-channel and N-channel III-Nitride Field Effect Transistor on a substrate. A preferred embodiment is that both the non-inverted P-channel III-Nitride FET and the non-inverted N-channel III-Nitride FET have normally-off (enhancement mode) characteristics.
Inverted N-Channel and P-Channel III-Nitride Field Effect Transistor on a Substrate This disclosure describes device structure and methods of fabrication for monolithic N-Channel and P-Channel III-Nitride Field effect transistors fabricated on a substrate for complementary circuits having an inverted P-channel III-Nitride FET fabricated in gallium polar (gallium face) III-nitride epitaxial material and an inverted N-channel III-Nitride FET fabricated in nitrogen polar (nitrogen face) III-nitride epitaxial material.

A technology for sequentially growing nitrogen polar and then gallium polar material on a substrate is described in U.S. Provisional patent application Ser. No. 13/235,624 with the title "Method for Vertical and Lateral Control of III-N Polarity." U.S. Provisional patent application Ser. No. 13/235,624 with the title "Method for Vertical and Lateral Control of III-N Polarity" also describes how to first grow a AlN polarity inversion material layer on Nitrogen polar or sapphire substrate that allows for the growth of Gallium polar (gallium face) epitaxial III-nitride layers in on the surface of the AlN polarity inversion material layer and nitrogen polar (nitrogen face) material in the selected area of the substrate that does not have the AlN polarity inversion material layer.

In the first device structure implementation, Inverted P-channel III-Nitride Field Effect Transistors (FET) are implemented (fabricated) in a first regions on a first gallium-polar (gallium face) III-Nitride material and an inverted N-channel III-Nitride Field Effect Transistors are implemented in second regions on a second nitrogen-polar (nitrogen face) III-Nitride material with both first gallium-polar III-Nitride material and the second nitrogen-polar III-Nitride material grown epitaxially on a substrate.

Two or more epitaxial growth steps can be used to fabricate the non-inverted P-channel and N-channel III-Nitride Field Effect Transistor on a substrate.

A preferred embodiment is that both the inverted P-channel III-Nitride FET and the inverted N-channel III-Nitride FET have normally-off (enhancement mode) characteristics.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

Figure 1:
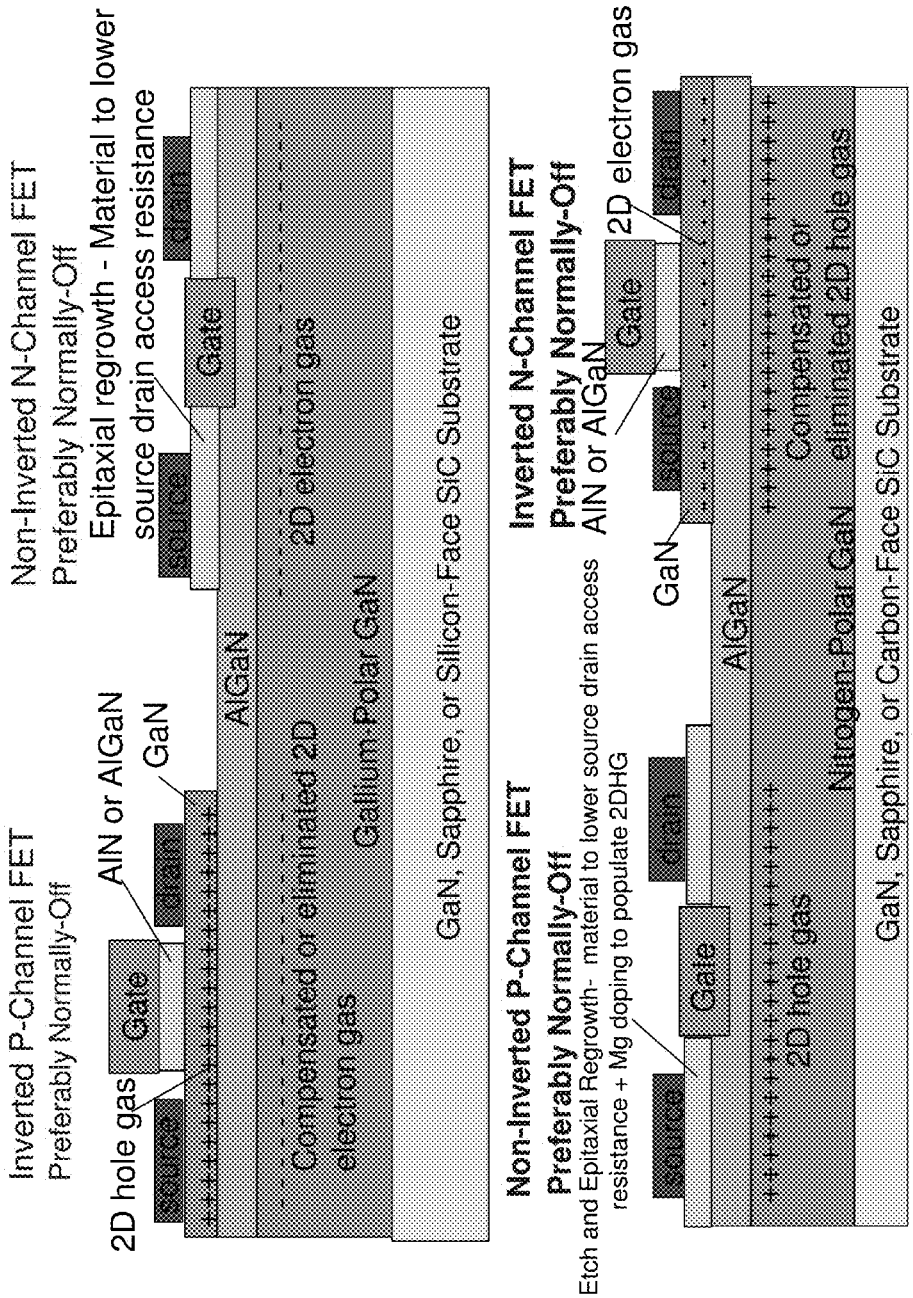
FIG. 1 illustrates inverted FET+non-inverted FET approach for III-N Complementary Transistors using epitaxial regrowth.
Figure 2:
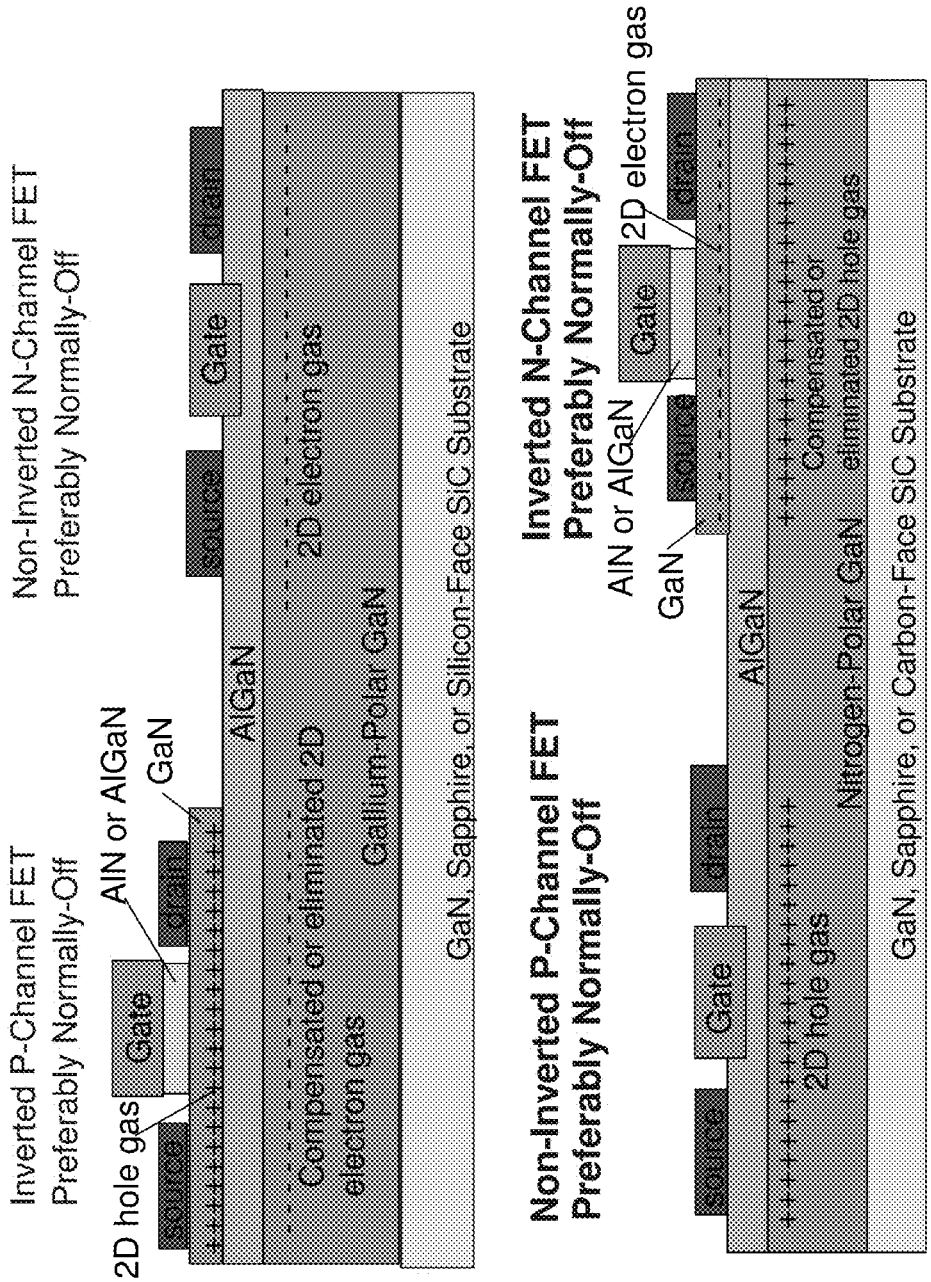
FIG. 2 illustrates inverted FET+non-inverted FET approach for III-N Complementary Transistors using one epitaxial growth.
Figure 3:
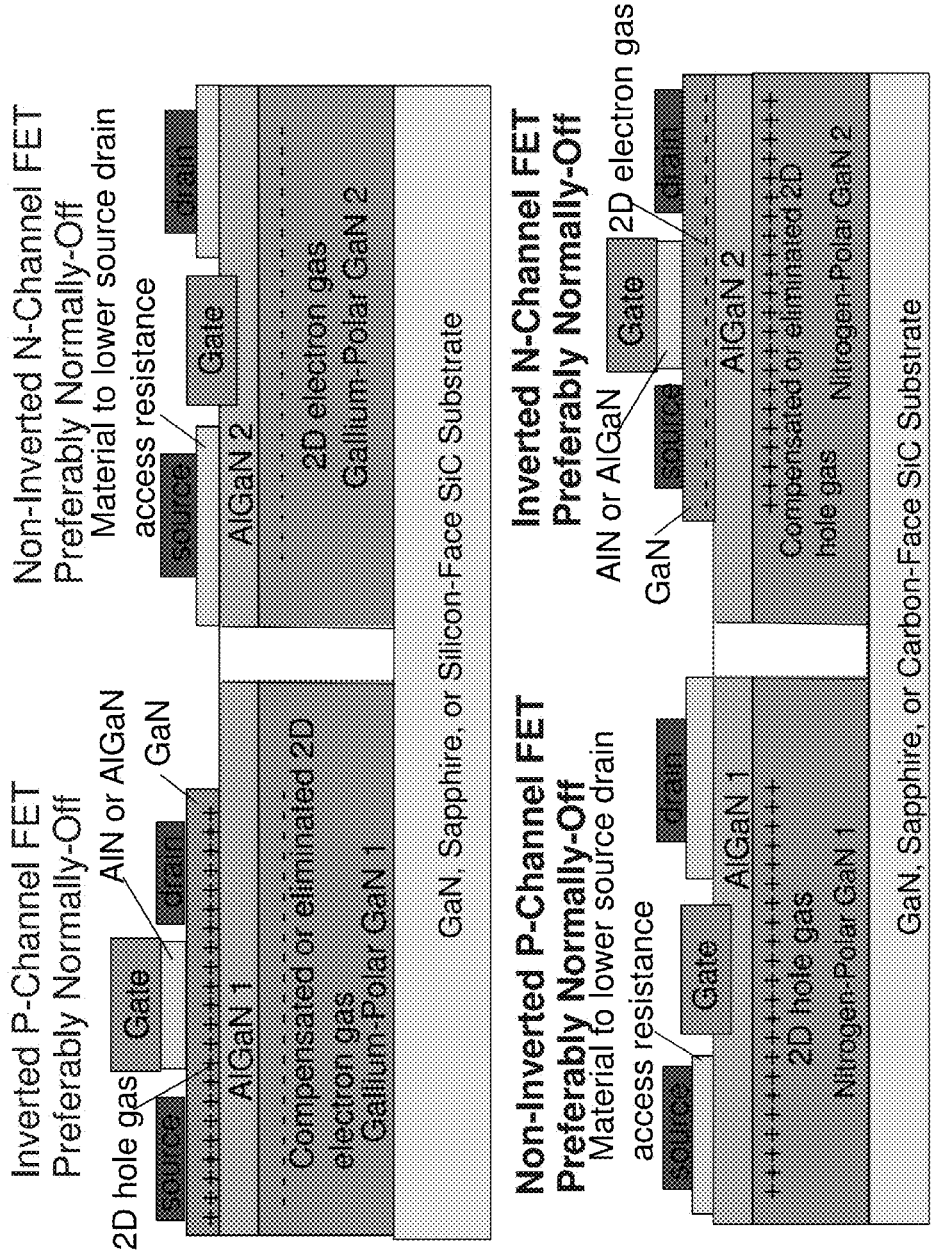
FIG. 3 illustrates inverted FET+non-inverted FET approach for III-N Complementary Transistors using one two epitaxial growths.
Figure 4:
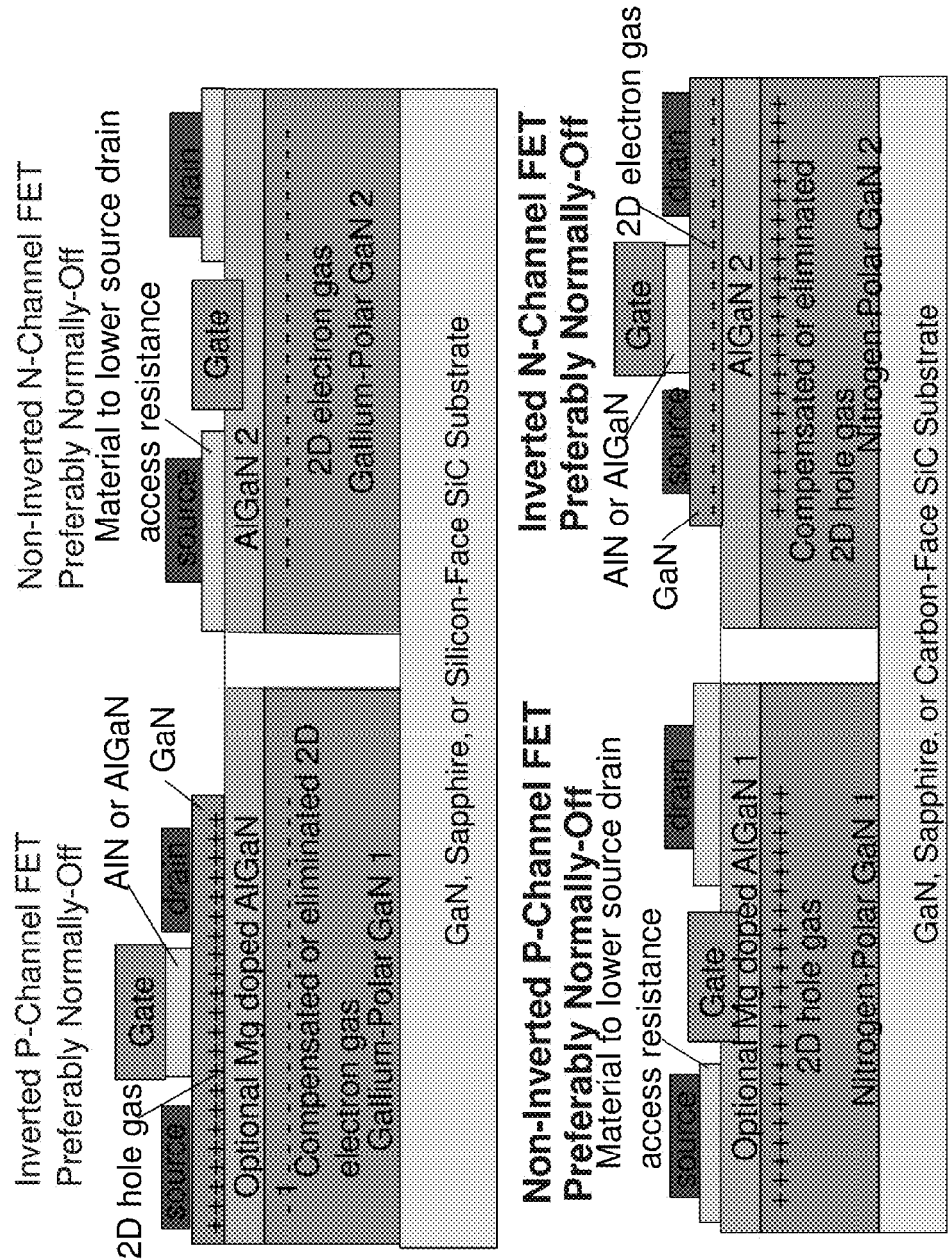
FIG. 4 illustrates inverted FET+non-inverted FET approach for III-N Complementary Transistors using one two epitaxial growths.

III-Nitride material layer: III-nitride material layer refers to a compound semiconductor formed from the elements indium, aluminum, gallium, or nitrogen that includes at least nitrogen and another alloying element from group III. Examples of III-nitride compound semiconductors are gallium nitride (GaN), aluminum nitride (AlN), aluminum gallium nitride (AlGaN), indium nitride (InN), indium gallium nitride (InGaN), indium aluminum nitride (InAlN), indium aluminum gallium nitride (InAlGaN), or any combination of elements that includes nitrogen and at least one element from group III. Gallium-polar: gallium-polar (gallium-face) material having a gallium polar (gallium-face) surface, typically grown on the Ga-polar (000-1) face of GaN of the wurtzite-phase material. Nitrogen-Polar: nitrogen-polar (nitrogen-face) material having a nitrogen polar (nitrogen-face) surface, typically grown on the nitrogen-polar (000-1) face of GaN.

III-Nitride barrier material: The III-Nitride barrier material can comprise of one or more III-Nitride barrier epitaxial layer(s). The III-Nitride barrier epitaxial layers in the barrier material can have different functions. For example, a barrier epitaxial layer can be selected to induce spontaneous polarization and/or piezoelectric polarization carrier density in the two-dimensional hole or electron gas. Another barrier epitaxial layer can be a thin III-Nitride spacer material layer such as a 1 nm thick AlN spacer (adjacent to the spontaneous polarization and/or piezoelectric polarization barrier epitaxial layer) to minimize the alloy scattering of carriers in the two-dimensional hole or electron gas. Another epitaxial layer in the barrier layer can serve as an etch stop layer.

The two-dimensional hole or electron gas will be at the interface of a III-Nitride barrier epitaxial layer and a III-Nitride channel epitaxial layer.

The barrier epitaxial layers can also be doped with a P-type dopant such as magnesium (modulation doping) to aid in providing hole carriers for the two-dimensional hole gas or doped with a N-type dopant such as silicon (modulation doping) to aid in providing electron carriers for the two-dimensional electron gas.

The III-Nitride barrier epitaxial layer(s) will typically be selected from the group of III-Nitride material such as GaN, AlN, AlGaN, InAlN, and AlInGaN.

The III-Nitride channel epitaxial layer that is adjacent to the III-Nitride barrier epitaxial layer can be typically selected from the group GaN or InGaN but can also include AlGaN or InAlN.

Example 1

Non-Inverted N-Channel and P-Channel III-Nitride Field Effect Transistor on a Substrate In the first device structure implementation, Non-Inverted P-channel III-Nitride Field Effect Transistors (FET) are implemented (fabricated) in first regions on a first nitrogen-polar (nitrogen face) III-Nitride material and an Non-Inverted N-channel III-Nitride Field Effect Transistors are implemented in second regions on a second gallium-polar III-Nitride material with both first and second III-Nitride material grown epitaxially on a substrate.

The nitrogen-polar III-Nitride material can comprise of one or more III-Nitride epitaxial material layers grown in such a manner that when GaN is epitaxially grown (and other III-Nitride epitaxial layers), the top surface of the epitaxial layer is nitrogen-polar (nitrogen-face).

The substrate can be selected for optimizing the epitaxial growth of nitrogen-polar III-Nitride material. For example, a carbon-face SiC substrate is known to allow the growth of nitrogen-polar III-Nitride material. A sapphire substrate without an AlN buffer can be used to grow nitrogen polar III-Nitride material. A gallium nitride bulk substrate can be used with the nitrogen-polar surface selected for epitaxial growth of the nitrogen-polar III-Nitride material. There are other substrates known to those skilled in the art that can be used to grow nitrogen polar material.

The non-inverted P-channel III-Nitride FET has a two-dimensional hole gas (2DHG) on the bottom side (side closest to the barrier) of a III-Nitride barrier material. The 2DHG will be at the interface of a III-Nitride barrier material and a III-Nitride channel epitaxial layer.

The Non-Inverted N-Channel transistor will have a two-dimensional electron gas (2DEG) on the top-side of the III-Nitride barrier material.

The first nitrogen-polar III-Nitride material can be epitaxially grown to have a different stacked sequence (combination) of III-Nitride epitaxial layers than the combination of epitaxial layers that are used for the second nitrogen-polar III-Nitride material. Thus, one epitaxial growth process can be used to grow the first nitrogen-polar III-Nitride material comprising a stacked sequence of III-nitride epitaxial layers.

A second epitaxial growth process can be use to grow the second gallium-polar III-Nitride material comprising a stacked sequence of III-nitride epitaxial layer. Thus, the III-Nitride first material and III-Nitride second material can be grown in two or more epitaxial growth operations.

The stacked sequence of III-Nitride epitaxial layers can include differences in doping of the III-Nitride epitaxial layer(s). For example, there can be a P-type dopant such as magnesium incorporated within the nitrogen-polar III-Nitride first material to act as a modulation doping source to aid in providing hole carriers for the two-dimensional hole gas.

The P-type doping can be a delta-doped layer within one of the III-Nitride epitaxial layers, a P-type doping within the III-Nitride barrier material, a P-type doping within one or more of the III-Nitride epitaxial layer (s), or other designs for incorporating P-type doping within the nitrogen-polar III-Nitride first material known to those skilled in the art.

One process sequence for growing the III-nitride nitrogen polar first material and III-Nitride gallium polar second material regions is to deposit oxide on a substrate, define an openings in a oxide to the substrate, selectively epitaxially grow the nitrogen-polar III-Nitride first material in the oxide opening using MOCVD, deposit an oxide material on the substrate that protects the nitrogen-polar III-Nitride first material from additional epitaxial growth, define openings in a oxide to the substrate, selectively epitaxially grow the AlN nucleation/polarity inversion layer, thereafter selective epitaxially grow the gallium-polar III-Nitride second material in the oxide opening using MOCVD.

The nitrogen-polar III-Nitride first material can be laterally adjacent (co-incident) to the gallium polar III-Nitride second material or the nitrogen-polar III-Nitride first material can be laterally separated from the gallium polar III-Nitride second material. In the case that the materials are laterally separated, an optional process is to deposit and planarize dielectric material in the region between the materials to reduce the topography to facilitate photolithography operations.

Another design that would be desirable is to perform only one gallium nitride buffer epitaxial growth process. In this case, an example of one process is to deposit oxide on a substrate, define an openings in a oxide to the substrate, selectively epitaxially grow the AlN nucleation/polarity inversion layer, etch the oxide from the remaining portion of the substrate, perform a second epitaxial step that would grow a common GaN buffer layer and optional barrier layer and optional epitaxial layers for carrier density enhancement in the source and drain access regions.

An example of a desirable embodiment is to etch selected III-Nitride epitaxial layers in the nitrogen-polar III-Nitride first material region and stop the etch at the top of the III-Nitride barrier material or at a cap III-Nitride epitaxial layer that is on the surface of the III-Nitride barrier material. The III-Nitride barrier material can be recessed (etched) in the area where the gate will be formed to achieve normally-off non-inverted N-channel III-Nitride FET as is known to those skilled in the art. A dielectric layer can also be incorporated between the gate and the III-Nitride barrier material. If the dielectric is selected to have positive charge, the negative charge can aid in achieving normally-off operation for the N-channel III-Nitride FET.

The non-inverted P-channel III-Nitride FET and the non-inverted N-channel III-Nitride FET can be implemented in a manner that is known to those that are skilled in the art. A preferred embodiment is that both the non-inverted P-channel III-Nitride FET and the non-inverted N-channel III-Nitride FET have normally-off (enhancement mode) characteristics and are implemented in a manner that is known to those skilled in the art.

A number of device implementations have been described in the literature for achieving normally-off operation for non-inverted N-channel III-Nitride FET devices. A common approach is to recess (thin) the III-Nitride barrier material in the region where the gate will be formed. This approach of recessing (thinning) the III-Nitride barrier material can also be use to implement normally-off non-inverted P-channel III-Nitride FET.

An example of an N-channel FET embodiment that can achieve normally-off operation for a non-inverted III-Nitride FET that uses selective etching to achieve an ultrathin barrier material layer is discussed in "Transistor with Enhanced Channel Charge Inducing Material Layer and Threshold Voltage Control" U.S. patent application Ser. No. 12/823,210. The basic device concepts discussed in U.S. patent application Ser. No. 12/823,210 for a normally-off N-channel FET such as using an ultrathin barrier layer and enhanced carrier charge in the source and drain access regions be used to achieve normally-off non-inverted P-channel III-Nitride FET, except that the process has to be modified for incorporating P-type ohmic contact metals, hole carriers in the channel, and optimized P-type dopant layers for modulation doping generation of free hole carriers.

There are other approaches for implementing normally-off Non-Inverted and Inverted III-Nitride Field Effect Transistors that are known to those skilled in the art. This disclosure describes a device structure in which a Non-Inverted P-channel III-Nitride Field Effect Transistors (FET) are implemented (fabricated) in first regions on a first nitrogen-polar (nitrogen face) III-Nitride material and an non-inverted N-channel III-Nitride Field Effect Transistors are implemented in second regions on a second gallium-polar III-Nitride material with both first and second nitrogen-polar III-Nitride material grown epitaxially on a substrate.

Photolithography defined procedures can then be used to remove one or more than one epitaxial layer(s) from the III-nitride first material or III-nitride second material. Etch stop material layers combined with selected wet chemical etching or selected plasma etching can facilitate the accurate etching of the III-Nitride material from either the first or second nitrogen-polar III-Nitride material region.

An example of a desirable embodiment is to etch selected III-Nitride epitaxial layers in the first nitrogen-polar III-Nitride material region and stop the etch at the top of the III-Nitride barrier material or at a cap III-Nitride epitaxial layer that is on the surface of the III-Nitride barrier material. The III-Nitride barrier material can be recessed (etched) in the area where the gate will be formed to achieve normally-off non-inverted P-channel III-Nitride FET as is known to those skilled in the art. A dielectric layer can also be incorporated between the gate and the III-Nitride barrier material. If the dielectric is selected to have positive charge, the positive charge can aid in achieving normally-off operation for the P-channel III-Nitride FET.

Examples of the types of N-channel and P-channel III-Nitride Field Effect Transistors include High Electron Mobility Transistor (HEMT), a HIGFET, a MOSHEMT, a MOSFET, etc.

One process sequence for growing the III-nitride nitrogen polar first material and III-Nitride gallium polar second material regions is to deposit oxide on a substrate, define an openings in a oxide to the substrate, selectively epitaxially grow the nitrogen-polar III-Nitride first material in the oxide opening using MOCVD, deposit an oxide material on the substrate that protects the nitrogen-polar III-Nitride first material from additional epitaxial growth, define openings in a oxide to the substrate, selectively epitaxially grow the AlN nucleation/polarity inversion layer, thereafter selective epitaxially grow the gallium-polar III-Nitride second material in the oxide opening using MOCVD.

Fabricate a normally-off non-inverted P-channel III-Nitride Field Effect transistor in the first nitrogen-polar III-Nitride. For example, we have earlier described a device structure and method of fabrication of a P-channel III-nitride field effect transistor.

The non-inverted P-channel transistor can be fabricated to be normally off using the concepts of ultrathin barrier layer and enhanced channel carrier density in the source and drain region as described in U.S. patent application Ser. No. 12/823,210, "Transistor with Enhanced Channel Charge Inducing Material Layer and Threshold Voltage Control," except that the ohmic contacts and channel carriers are for a P-type transistor rather than a N-channel transistor. The basic device concepts discussed in U.S. patent application Ser. No. 12/823,210 for a normally off N-channel FET such as using an ultrathin barrier layer and enhanced carrier charge in the source and drain access regions can be used to achieve normally-off non-inverted P-channel III-Nitride FET, except that the process has to be modified for incorporating P-type ohmic contact metals, hole carriers in the channel, optimized P-type dopant layers for modulation doping generation of free hole carriers.

Fabricate a normally-off non-inverted N-channel III-Nitride Field Effect transistor in the gallium-polar III-Nitride second material using procedures known to those skilled in the art.

Example 2

Outline of Process Steps to Fabricate Complementary Non-Inverted P-Channel and Non-Inverted N-Channel III-Nitride Field Effect Transistors on a Substrate 1. Grow III-nitride epitaxial layers on a substrate in such a manner that the nitrogen-polar (001) face is the dominant face for growth of III-Nitride material. Typically substrates that can be used for the preferred III-nitride nitrogen polar growth are sapphire, carbon face SiC, GaN nitrogen polar.
2. Deposit an oxide on a substrate.
3. Use photolithography define an openings in the oxide to the substrate.

4. Selectively epitaxially grow the first nitrogen-polar III-Nitride material including epitaxial layers such as GaN buffer layer, AlGaN back barrier, channel layer, spacer layer, barrier layer, cap layer, carrier enhancement epitaxial layer for the source drain access region, etc that are known to those skilled in the art using the oxide opening to selectively grow the epitaxial layers using MOCVD.
5. Deposit an oxide material on the substrate such that the oxide protects the first nitrogen-polar III-Nitride from additional epitaxial growth.
6. Use photolithography to define openings in a oxide to the substrate.
7. Selectively epitaxially grow an AlN nucleation layer/polarity inversion layer.
8. Selectively epitaxially grow gallium-polar III-Nitride second material including epitaxial layers such as GaN buffer layer, AlGaN back barrier, channel layer, spacer layer, barrier layer, cap layer, carrier enhancement epitaxial layer for the source drain access region, etc that are known to those skilled in the art using the oxide opening to selectively grow the epitaxial layers using MOCVD.
9. Deposit dielectric and planarize the dielectric to reduce the topography at the edge of the first and second nitrogen-polar III-Nitride material to facilitate photolithography operation.
10. Fabricate a normally-off non-inverted P-channel III-Nitride Field Effect transistor in the first nitrogen-polar III-Nitride using procedures known to those skilled in the art. Recess etching of the barrier material in the gate area can be used to achieve normally-off P-channel III-Nitride field effect transistor.
11. Fabricate a normally-off non-inverted N-channel III-Nitride Field Effect transistor in the second gallium-polar III-Nitride using procedures known to those skilled in the art.

Example 3

Inverted N-Channel and P-Channel III-Nitride Field Effect Transistor on a Substrate In a second device structure implementation, Inverted P-channel III-Nitride Field Effect Transistors (FET) are implemented (fabricated) in first regions on a gallium-polar (gallium-face) III-Nitride first material and an Inverted N-channel III-Nitride Field Effect Transistors are implemented in second regions on a nitrogen-polar III-Nitride second material with both first and second gallium-polar III-Nitride material grown epitaxially on a substrate.

The gallium-polar III-Nitride material can comprise of one or more III-Nitride epitaxial material layers grown in such a manner that when GaN is epitaxially grown (and other III-Nitride epitaxial layers), the top surface of the epitaxial layer is gallium-polar (gallium-face). The substrate can be selected for optimizing the epitaxial growth of nitrogen-polar III-Nitride material. For example, a carbon-face SiC substrate is known to allow the growth of nitrogen-polar III-Nitride material. A sapphire substrate without an AlN buffer can be used to grow nitrogen polar III-Nitride material. A gallium nitride bulk substrate can be used with the nitrogen-polar surface selected for epitaxial growth of the nitrogen-polar III-Nitride material. There are other substrates known to those skilled in the art that can be used to grow nitrogen-polar material.

The inverted N-channel III-Nitride FET will have a two-dimensional electron gas (2DEG) on the bottom side (side closet to the substrate) of a III-Nitride barrier material.

The Inverted N-channel transistor also has the potential to have a two-dimensional hole gas on the top side of the III-Nitride barrier material. The epitaxial layers and the doping in the second nitrogen-polar III-Nitride material is preferable grown to compensate or eliminate the two-dimensional hole gas at the top of the III-Nitride channel epitaxial layer.

The Inverted P-Channel transistor has a two-dimensional hole gas (2DHG) on the bottom of the III-Nitride barrier material. The Inverted P-Channel transistor also has the potential to have a two-dimensional electron gas on the top side of the III-Nitride barrier material. The epitaxial layers and the doping in the first nitrogen-polar III-Nitride material is preferable grown to compensate or eliminate the two-dimensional electron gas at the top of the III-Nitride barrier layer.

The gallium polar III-Nitride second material can be selected to incorporate epitaxial layer and/or doping to eliminate the two-dimensional hole gas at the top side of the III-Nitride barrier material. For example, N-type doping can be incorporated into the second nitrogen polar III-Nitride material to compensate or eliminate the 2DHG on the top side of the barrier material.

The gallium-polar III-Nitride first material can be epitaxially grown to have a different stacked sequence (combination) of III-Nitride epitaxial layers than the combination of epitaxial layers that are used for the gallium-polar III-Nitride second material. Thus, one epitaxial growth process can be used to grow the gallium-polar III-Nitride first material comprising a stacked sequence of III-nitride epitaxial layers. A second epitaxial growth process can be use to grow the nitrogen-polar III-Nitride second material comprising a stacked sequence of III-nitride epitaxial layer. Thus, the III-nitride first material and III-nitride second material can be grown in two or more epitaxial growth operations. The stacked sequence of III-Nitride epitaxial layers can include differences in doping of the III-Nitride epitaxial layer(s). One process sequence for growing the III-nitride nitrogen polar first material and III-Nitride gallium polar second material regions is to deposit oxide on a substrate, define an openings in a oxide to the substrate, selectively epitaxially grow the nitrogen-polar III-Nitride first material in the oxide opening using MOCVD, deposit an oxide material on the substrate that protects the nitrogen-polar III-Nitride first material from additional epitaxial growth, define openings in a oxide to the substrate, selectively epitaxially grow the AlN nucleation/polarity inversion layer, thereafter selective epitaxially grow the gallium-polar III-Nitride second material in the oxide opening using MOCVD.

For example, there can be a P-type dopant such as magnesium incorporated within the gallium-polar III-Nitride first material to act as a modulation doping source to aid in providing hole carriers for the two-dimensional hole gas. The P-type doping can be a delta-doped layer within one of the III-Nitride epitaxial layers, a P-type doping within the III-Nitride barrier material, a P-type doping within one or more of the III-Nitride epitaxial layer (s), or other designs for incorporating P-type doping within the gallium-polar III-Nitride first material known to those skilled in the art.

The gallium-polar III-Nitride first material epitaxial layers can be selected to incorporate epitaxial layer and/or doping to eliminate the two-dimensional electron gas at the top side of the III-Nitride barrier material. For example, P-type doping can be incorporated into the second gallium polar III-Nitride material to compensate or eliminate the 2DEG on the top side of the barrier material.

The gallium-polar III-Nitride first material can be laterally adjacent (co-incident) to the second nitrogen polar III-Nitride second material or the gallium-polar III-Nitride first material can be laterally separated from the nitrogen polar III-Nitride second material. In the case that the materials are laterally separated, an optional process is to deposit and planarize dielectric material in the region between the materials to reduce the topography to facilitate photolithography operations.

Another design that would be desirable is to perform only one epitaxial growth process. In this case, the first and second region gallium Nitride buffer material would be the same and produced in one epitaxial growth process. Photolithography defined procedures can then be used to remove one or more than one epitaxial layer(s) from the III-Nitride first or second material regions. Etch stop material layers combined with selected wet chemical etching or selected plasma etching can facilitate the accurate etching of the III-Nitride material from either the first or second nitrogen-polar III-Nitride material region.

The inverted N-channel III-Nitride FET and the inverted P-channel III-Nitride FET can be implemented in a manner that is known to those that are skilled in the art. A preferred embodiment is that both the inverted N-channel III-Nitride FET and the inverted P-channel III-Nitride FET have normally-off (enhancement mode) characteristics and can be implemented in a manner that is known to those skilled in the art.

The approach to achieve normally-off operation for an Inverted N-channel III-Nitride FET is to incorporated a compensating III-Nitride epitaxial material such as AlGaN, AlN, InAlN, or AlInGaN epitaxial layer (or a stacked sequence of III-nitride epitaxial materials) on top of the III-Nitride epitaxial channel layer (typically a GaN epitaxial layer) in the area beneath the gate (or gate region) that completely or partially compensates (cancels) the spontaneous polarization and/or piezoelectric polarization induced two-dimensional electron gas at the top side of the III-Nitride barrier material (i.e., at the interface between the channel III-Nitride epitaxial layer and the III-Nitride barrier material layer).

The compensating III-Nitride epitaxial material can comprise AlGaN, AlN, InAlN, or AlInGaN epitaxial layer (or a stacked sequence of III-nitride epitaxial materials).

The two-dimensional electron will have a high carrier density in the III-Nitride epitaxial channel layer in those regions where the compensating III-Nitride epitaxial material is not on top of the III-Nitride epitaxial channel layer. Thus, those regions can have low source and drain access resistance.

The compensating III-Nitride epitaxial material will preferably be beneath the gate or gate region but not extend laterally significantly into the source or drain access region in order to allow a low source and drain access resistance. The compensating III-Nitride epitaxial material can be self-aligned to the gate or preferably extend less than 1.0 microns into the source or drain access region. The thickness of the III-Nitride epitaxial channel layer is selected so that a 2DEG is formed but not so thick that a 2DHG can be formed within the III-Nitride epitaxial channel layer. The III-Nitride epitaxial channel layer will typically consist of a GaN epitaxial layer and have a thickness of approximately 20 nm. The III-Nitride FET can incorporate an insulating dielectric beneath the gate to reduce the gate leakage current and allow applying a bias between the gate and source without leakage There are other approaches for implementing normally-off Inverted N-channel and P-Channel III-Nitride Field Effect Transistors that are known to those skilled in the art. This disclosure describes a device structure in which a Inverted P-channel III-Nitride Field Effect Transistors (FET) are implemented (fabricated) in first regions on a gallium-polar (gallium-face) III-Nitride first material and an Inverted N-channel III-Nitride Field Effect Transistors are implemented in second regions on a nitrogen-polar III-Nitride second material with both III-nitride first material and second material grown epitaxially on a substrate.

Examples of the types of III-Nitride Field Effect Transistors include High Electron Mobility Transistor (HEMT), a HIGFET, a MOSHEMT, a MOSFET, etc.

Example 4

Outline of Process Steps to Fabricate Complementary Inverted P-Channel Transistor and Inverted N-Channel III-Nitride Field Effect Transistors on a Substrate 1. Grow III-nitride epitaxial layers on a substrate in such a manner that the nitrogen-polar (001) face is the dominant face for growth of III-Nitride material. Typically substrates that can be used for the preferred III-nitride nitrogen polar growth are sapphire, carbon face SiC, GaN nitrogen polar.
2. Deposit an oxide on a substrate.
3. Use photolithography define an openings in the oxide to the substrate.
4. Selectively epitaxially grow the gallium-polar III-Nitride first material including epitaxial layers such as GaN buffer layer, AlGaN back barrier, channel layer, spacer layer, barrier layer, cap layer, carrier enhancement epitaxial layer for the source drain access region, etc that are known to those skilled in the art using the oxide opening to selectively grow the epitaxial layers using MOCVD.
5. Deposit an oxide material on the substrate such that the oxide protects the first nitrogen-polar III-Nitride from additional epitaxial growth.
6. Use photolithography to define openings in a oxide to the substrate.
7. Selectively epitaxially grow an AlN nucleation layer/polarity inversion layer.
8. Selectively epitaxially grow gallium-polar III-Nitride second material including epitaxial layers such as GaN buffer layer, AlGaN back barrier, channel layer, spacer layer, barrier layer, cap layer, carrier enhancement epitaxial layer for the source drain access region, etc that are known to those skilled in the art using the oxide opening to selectively grow the epitaxial layers using MOCVD.
9. Deposit dielectric and planarize the dielectric to reduce the topography at the edge of the first and second nitrogen-polar III-Nitride material to facilitate photolithography operation.
10. Fabricate a normally-off inverted P-channel III-Nitride Field Effect transistor in the nitrogen-polar III-Nitride first material using procedures known to those skilled in the art.
11. Fabricate a normally-off inverted N-channel III-Nitride Field Effect transistor in the gallium-polar III-Nitride second material using procedures known to those skilled in the art.

III-Nitride Complementary Field Effect Technology will enable "CMOS like" circuit technology that will have high frequency capability and high voltage operation capability.

The mobility of electrons in 2DEG can be as high as 2000 V/cm-s and the mobility of holes in a 2DHG can be as high as approximately 500 V/cm-s.

These mobility values are significantly higher then the mobility for electrons and holes in silicon MOS structures.

High voltage III-Nitride complementary circuit is possible because of the factor of ten high break down field for GaN than for silicon.

A complementary circuit technology is also advantage for power integrated circuits (PIC) because a the availability of a P-channel upper level transistor in a half-bridge can be driven with a single gate driver compared to a required two-gate drivers if the P-channel transistor is not available.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A device with complementary non-inverted N-channel and inverted P-channel field effect transistors using gallium polar III-Nitride material comprising:
    a first gallium-polar III-Nitride material layer grown epitaxially on a substrate;
    a III-Nitride barrier material layer;
    a two-dimensional electron gas in the first gallium-polar III-Nitride material layer at the interface of the III-Nitride barrier material layer;
    a second III-Nitride material layer;
    a two-dimensional hole gas in the second III-Nitride material layer at the interface of the III-Nitride barrier material layer;
    a non-inverted N-channel III-Nitride field effect transistor in the first gallium-polar III-Nitride material layer;
    wherein the non-inverted N-channel III-Nitride field effect transistor has a two-dimensional electron gas; and
    an inverted P-Channel III-Nitride field effect transistor in the second III-Nitride material layer;
    wherein the inverted P-Channel III-Nitride field effect transistor has a two-dimensional hole gas.

2. The device with complementary non-inverted N-channel and inverted P-channel field effect transistors using gallium polar III-Nitride material of claim 1 wherein the substrate is one selected from the group consisting of a silicon-face SiC substrate, a sapphire substrate with an AlN buffer, and a gallium nitride bulk substrate.

3. The device with complementary non-inverted N-channel and inverted P-channel field effect transistors using gallium polar III-Nitride material of claim 2 wherein a P-type dopant comprises magnesium and is incorporated in a region of the first gallium-polar III-Nitride material to act as a modulation doping source to aid in providing hole carriers for the two-dimensional hole gas.

4. The device with complementary non-inverted N-channel and inverted P-channel field effect transistors using gallium polar III-Nitride material of claim 3 wherein a P-type doped region is incorporated as a delta-doped layer within one of the III-Nitride material layers or within the III-Nitride barrier material.

5. A device with complementary inverted N-channel and non-inverted P-channel field effect transistors using nitrogen polar III-Nitride material comprising:
    a first nitrogen-polar III-Nitride material layer grown epitaxially on a substrate;
    a III-Nitride barrier material layer;
    a two-dimensional hole gas in the first nitrogen-polar III-Nitride material layer at the interface of the III-Nitride barrier material layer;
    a second III-Nitride material layer;
    a two-dimensional electron gas in the second III-Nitride material layer at the interface of the III-Nitride barrier material layer;
    an inverted N-channel III-Nitride field effect transistor in the first nitrogen-polar III-Nitride material layer;
    wherein the inverted N-channel III-Nitride field effect transistor has a two-dimensional electron gas; and
    a non-inverted P-Channel III-Nitride field effect transistor in the second III-Nitride material layer;
    wherein the non-inverted P-Channel III-Nitride field effect transistor has a two-dimensional hole gas.

6. The device with complementary inverted N-channel and non-inverted P-channel field effect transistors using gallium polar III-Nitride material of claim 5 further including a channel layer in the second III-Nitride material layer and a compensating III-Nitride epitaxial material in the second III-Nitride material channel layer.

7. The device with complementary inverted N-channel and non-inverted P-channel field effect transistors using gallium polar III-Nitride material of claim 6 wherein the compensating III-Nitride epitaxial material is one selected from the group consisting of AlGaN, AlN, InAlN, AlInGaN, and combinations thereof.

8. A method of making complementary inverted P-channel and non-inverted N-channel III-Nitride field effect transistors on a substrate comprising:
    growing a first gallium-polar III-Nitride material including epitaxial layers such as a GaN buffer layer, a AlGaN back barrier, a channel layer, a spacer layer, a barrier layer, a cap layer, and a carrier enhancement epitaxial layer for the source drain access region;
    depositing an oxide material on the substrate such that the oxide material protects a region of the first gallium-polar III-Nitride material from additional epitaxial growth;
    growing a second gallium-polar III-Nitride material including epitaxial layers such as a charge compensation layer, a channel layer, a spacer layer, a cap layer, and a carrier enhancement epitaxial layer for the source drain access region;
    fabricating a non-inverted N-channel III-Nitride Field Effect transistor in the first gallium-polar III-Nitride material layer; and
    fabricating an inverted P-channel III-Nitride Field Effect transistor in the second gallium-polar III-Nitride material layer.

9. The method of making complementary inverted P-channel and non-inverted N-channel III-Nitride field effect transistors on a substrate of claim 8 wherein the substrate is one selected from the group consisting of sapphire, silicon face SiC, and GaN gallium polar.

10. The method of making complementary inverted P-channel and non-inverted N-channel III-Nitride field effect transistors on a substrate of claim 9 wherein the step of defining an opening in the oxide is by way of photolithography.

11. The method of making complementary inverted P-channel and non-inverted N-channel III-Nitride field effect transistors on a substrate of claim 10 wherein the step of fabricating a normally-off non-inverted N-channel III-Nitride Field Effect transistor in the first nitrogen-polar III-Nitride material is by way of etching the barrier material in a gate area.

12. A method of making complementary non-inverted P-channel field effect transistor and inverted N-channel III-Nitride field effect transistors on a substrate comprising:
   growing a first nitrogen-polar III-Nitride material including epitaxial layers such as a GaN buffer layer, a AlGaN back barrier, a channel layer, a spacer layer, a barrier layer, a cap layer, and a carrier enhancement epitaxial layer for the source drain access region;
   depositing an oxide material on the substrate such that the oxide material protects a region of the first nitrogen-polar III-Nitride material from additional epitaxial growth;
   growing a second nitrogen-polar III-Nitride material including epitaxial layers such as a charge compensation layer, a channel layer, a spacer layer, a cap layer, and a carrier enhancement epitaxial layer for the source drain access region;
   fabricating a non-inverted P-channel III-Nitride Field Effect transistor in the first nitrogen-polar III-Nitride material layer; and
   fabricating an inverted N-channel III-Nitride Field Effect transistor in the second III-Nitride material layer.

* * * * *